United States Patent
Xia et al.

(10) Patent No.: US 6,255,222 B1
(45) Date of Patent: Jul. 3, 2001

(54) METHOD FOR REMOVING RESIDUE FROM SUBSTRATE PROCESSING CHAMBER EXHAUST LINE FOR SILICON-OXYGEN-CARBON DEPOSITION PROCESS

(75) Inventors: Li-Qun Xia; Himanshu Pokharrna, both of San Jose; Tian-Hoe Lim, Santa Clara, all of CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 09/379,834

(22) Filed: Aug. 24, 1999

(51) Int. Cl.[7] .................................................. H01L 21/00

(52) U.S. Cl. .......................... 438/710; 156/345; 134/1.1; 134/31; 216/67; 216/69; 438/905; 438/726

(58) Field of Search ..................................... 438/689, 710, 438/726, 727, 730, 905; 156/345 P; 134/1.1, 31; 216/67, 69; 118/715, 723 ME, 723 IR (56) References Cited

U.S. PATENT DOCUMENTS

| | | | |
|---|---|---|---|
| 4,608,063 | 8/1986 | Kurokawa | 55/208 |
| 4,657,738 | 4/1987 | Kanter et al. | 422/186.04 |

(List continued on next page.)

FOREIGN PATENT DOCUMENTS

| | | |
|---|---|---|
| 1282732A | 9/1991 | (CA). |
| 43 19 118 A1 | 12/1994 | (DE). |

(List continued on next page.)

OTHER PUBLICATIONS

Danielson et al., "Use DryScrub to Improve Hot Wall Nitride Equipment Reliability," *Product Application Report*, pp. 1–6.

Hayward, W.H., "Introduction to Radio Frequency Design," *Library of Congress Cataloging in Publication Data*, pp. 135–137, (1982).

(List continued on next page.)

*Primary Examiner*—William Powell
(74) *Attorney, Agent, or Firm*—Townsend and Townsend and Crew (57) ABSTRACT

A method of minimizing particle or residue accumulation within an exhaust line of a substrate processing chamber having a downstream plasma apparatus connected to the exhaust line. One embodiment of the method turns ON the downstream plasma apparatus during a substrate deposition step and a chamber clean operation, and switches the downstream plasma apparatus OFF at other times including the time during which purge gases are flowed into the chamber and various chamber set up or conditioning steps are performed. The method includes depositing a film over a substrate disposed in the substrate processing chamber by (i) flowing a deposition gas into the substrate processing chamber, exhausting at least some of the deposition gas from the processing chamber through an exhaust line and into the downstream plasma apparatus, and forming a plasma within the downstream plasma apparatus; and then (ii) stopping the flow of the deposition gas, turning the plasma OFF, and flowing a purge gas into the substrate processing chamber. After one or more film deposition steps, the chamber is cleaned to remove film deposition from the interior surfaces of the chamber by (i) flowing an etchant into the substrate processing chamber, exhausting the etchant from the substrate processing chamber through an exhaust line and into the downstream plasma apparatus, and forming a plasma within the downstream plasma apparatus; and then (ii) stopping the flow of the etchant, turning the plasma OFF, and flowing a purge gas into the substrate processing chamber.

20 Claims, 4 Drawing Sheets

U.S. PATENT DOCUMENTS

| | | | |
|---|---|---|---|
| 4,735,633 | 4/1988 | Chiu | 55/2 |
| 4,816,046 | 3/1989 | Maeba et al. | 55/209 |
| 5,000,113 | 3/1991 | Wang et al. | 118/723 |
| 5,141,714 | 8/1992 | Obuchi et al. | 422/174 |
| 5,211,729 | 5/1993 | Sherman | 55/186 |
| 5,323,013 | 6/1994 | Kelly et al. | 250/522.1 |
| 5,417,826 | 5/1995 | Blalock | 204/176 |
| 5,451,378 | 9/1995 | Russell et al. | 412/186.3 |
| 5,453,125 | 9/1995 | Krogh | 118/723 MR |
| 5,453,305 | 9/1995 | Lee | 427/562 |
| 5,756,400 * | 5/1998 | Ye et al. | 438/710 |
| 5,827,370 | 10/1998 | Gu | 118/715 |

FOREIGN PATENT DOCUMENTS

| | | |
|---|---|---|
| 19601 436 A1 | 7/1997 | (DE). |
| 0 158 823 A2 | 10/1985 | (EP). |
| 0 176295 | 4/1986 | (EP). |
| 0289 858 A1 | 4/1988 | (EP). |
| 0 296 720 A2 | 12/1988 | (EP). |
| 0 296 720 A3 | 12/1988 | (EP). |
| 0781 599 A2 | 2/1997 | (EP). |
| 0 767 254 A1 | 4/1997 | (EP). |
| 0781 599 A3 | 10/1997 | (EP). |
| 51-129868 | 11/1976 | (JP). |
| 52-78176 | 7/1977 | (JP). |
| 58-101722 | 6/1983 | (JP). |
| 59-181619 | 10/1984 | (JP). |
| 60-234313 | 11/1985 | (JP). |
| 63-28869 | 2/1988 | (JP). |
| 01 288 355 | 11/1989 | (JP). |
| 02 125876 | 5/1990 | (JP). |
| 4-136175 | 5/1992 | (JP). |
| 05 202474 | 8/1993 | (JP). |
| 09 010 544 | 1/1997 | (JP). |
| WO80/01363 | 7/1980 | (WO). |

OTHER PUBLICATIONS

Lieberman et al., "Principles of Plasma Discharges and Materials Processing," *Library of Congress Cataloging in Publication Data*, pp. 404–410, (1994).

Mocella et al., "Options for Environmentally Impacted Perfluorinated Gases Used in Plasma Processing," *10th Symposium Plasma Etching*, pp. 192–200 (1994).

Mocella et al., "Etch Process Characterization Using Neural Network Methodology: A Case Study," *SPIE Process Module Metrology, Control, and Clustering*, 1594:232–242 (1991).

Mohindra et al., "Abatement of Perfluorocompounds (PFCs) in a Microwave Tubular Reactor Using O2 As An Additive Gas," *Department of Chemical Engineering*, MIT, pp. 1–59.

Singer et al., "Pre–pump Scrubbers Simplify Maintenance and Improve Safety," *Semiconductor International*, pp. 1–3.

* cited by examiner

METHOD FOR REMOVING RESIDUE FROM SUBSTRATE PROCESSING CHAMBER EXHAUST LINE FOR SILICON-OXYGEN-CARBON DEPOSITION PROCESS

BACKGROUND OF THE INVENTION

The present invention relates generally to the field of semiconductor processing equipment and more specifically to a method for eliminating contaminants and residues from inside a vacuum exhaust line connected to a processing chamber.

During chemical vapor deposition (CVD) processing, deposition gases are released inside a processing chamber to form a thin film layer on the surface of a substrate being processed. Unwanted deposition on areas such as the walls of the processing chamber also occurs during such CVD processes. Because the residence time in the chamber of individual molecules in some deposition gases is relatively short, however, only a small portion of the molecules released into the chamber are consumed in the deposition process and deposited on either the wafer or chamber walls.

The unconsumed gas molecules are pumped out of the chamber along with partially reacted compounds and reaction byproducts through a vacuum exhaust line that is commonly referred to as the "foreline." Many of the compounds in this exhausted gas are still in highly reactive states and/or contain residues or particulate matter that can form unwanted deposits in the foreline. Given time, this deposition build-up of residue and/or particulate matter presents a problem. For example, if enough of the deposition material builds-up in the foreline, the foreline and/or its associated vacuum pump may clog if it is not appropriately cleaned. Even when periodically cleaned, matter build-up interferes with normal operation of the vacuum pump and can drastically shorten the useful life of the pump. Also, the solid matter may backwash from the foreline into the processing chamber and contaminate processing steps adversely effecting wafer yield.

As is known in the industry, it is common to remove deposition material that builds up on the interior of chamber walls with an in situ chamber clean operation. Common chamber cleaning techniques include the use of an etching gas, such as fluorine, to remove the deposited material from the chamber walls and other areas. In some processes, the etching gas is introduced into the chamber and a plasma is formed so that the etching gas reacts with and removes the deposited material from the chamber walls. Such cleaning procedures are commonly performed between deposition steps for every wafer or every n wafers.

Removal of deposition material from chamber walls is relatively straightforward in that the plasma is created within the chamber in an area proximate to the deposited material. Removal of deposition material from the foreline is more difficult because the foreline is downstream from the processing chamber. In a fixed time period, most points within the processing chamber come in contact with more of the etchant fluorine atoms than do points within the foreline. Thus, in a fixed time period, the chamber may be adequately cleaned by the clean process while residue and similar deposits remain in the foreline.

One method of attempting to adequately clean the foreline increases the duration of the clean operation. This is generally undesirable, however, because it adversely effects wafer throughput. Also, such residue build-up can be cleaned only to the extent that reactants from the clean step are exhausted into the foreline in a state that they may react with the residue in the foreline. In some systems and applications, the lifetime of the exhausted reactants is not sufficient to reach the end or even middle portions of the foreline. In these systems and applications, residue build-up in the middle or end of the foreline cannot be removed by an extra long clean step. Accordingly, there is a need for an apparatus for efficiently and thoroughly cleaning the foreline in a semiconductor processing system and a method of doing the same.

Several different devices have been designed to facilitate the cleaning of such forelines. One approach that has been employed to clean the foreline is to trap the particulate matter present in the exhaust stream before it reaches the vacuum pump by diverting gas flow into a collection chamber from which particulate matter cannot easily escape. Devices that rely on this technique provide a removable door or similar access to the collection chamber so that once a sufficient amount of material has built up within the chamber it can be easily removed. Typically, the substrate deposition system is temporarily shut off during the period in which the collection chamber is cleaned, thereby limiting or reducing wafer throughput of the system.

Another approach relies on a scrubbing system that uses plasma enhanced CVD techniques to extract reactive components in the exhaust gas as film deposits on electrode surfaces. The scrubbing system is designed to maximize the removal of reactants as a solid film and uses large surface area spiral electrodes. The spiral electrodes are contained within a removable canister that is positioned near the end of the foreline between the blower pump and mechanical pump. After a sufficient amount of solid waste has built up on the electrodes, the canisters may be removed for disposal and replacement.

Problems exist in this prior art method in that the system relies on the large surface area of the electrodes to provide an area for deposited solid matter to collect. To accommodate the large surface area of the electrodes, the system is necessarily large and bulky. Furthermore, extra expenses are incurred in the operation of this prior art scrubber system since the removable canister is a disposable product that must be replaced and properly disposed. Also, the scrubbing system is located downstream from a beginning portion of the vacuum foreline and thus does not ensure removal of powdery material or particulate matter that builds-up in this portion of the line.

Applied Materials, the assignee of the present invention, has developed a much improved method for cleaning the foreline that relies on what is sometimes referred to as a Downstream Plasma Apparatus or "DPA" for short. The DPA traps particulate matter generated from film deposition steps and converts the trapped particulate matter into volatile products that can be subsequently pumped through the foreline without clogging the vacuum pump. The conversion process relies on forming a plasma from an etchant gas in the area where the particles are trapped. Examples of different DPA devices are set forth in U.S. application Ser. No. 08/741,230, filed Oct. 30, 1996, entitled PARALLEL PLATE APPARATUS FOR IN-SITU VACUUM LINE CLEANING FOR SUBSTRATE PROCESSING EQUIPMENT and U.S. application Ser. No. 09/354,925, filed Jul. 15, 1999, entitled HEATED ELECTROSTATIC PARTICLE TRAP FOR IN-SITU VACUUM LINE CLEANING OF A SUBSTRATE PROCESSING CHAMBER.

In one typical mode of operation, the DPA plasma is formed while a chamber clean operation is being performed. Etchant gas exhausted from the substrate processing chamber during the clean process is dissociated in the DPA plasma. Constituents from the plasma then react with the particles and residue trapped within the DPA to form the volatile reaction byproducts. The 08/741,230 application states that another mode of operation, a passive mode, the DPA is left on to form a plasma during both film deposition and chamber cleaning operations.

DPA devices can be used to keep the foreline clean in a variety of film deposition processes including a silicon nitride film deposition processes that is generally known to be a particularly dirty process. A DPA device operates such that over time, trapped particles and/or residue are converted into volatile material at a rate at least equal to the rate at which the particles/residue accumulate. In this manner, the DPA keeps the foreline clean without temporarily shutting down the substrate processing system to empty particles from the DPA. Thus importantly, the use of the DPA does not decrease wafer throughput.

In order to meet the requirements for future generations of integrated circuits, new technology is constantly being developed and explored. For example, today's fabrication plants are routinely producing devices having 0.25 $\mu$m and even 0.18 $\mu$m feature sizes, and tomorrow's plants soon will be producing devices having even smaller geometries. In order to further reduce the size of devices on integrated circuits, the semiconductor industry has spent much time and effort developing conductive materials having low resistivity and insulation materials having a low dielectric constant. Low dielectric constant insulation films are particularly desirable for premetal dielectric (PMD) layers and intermetal dielectric (IMD) layers to reduce the RC time delay of the interconnect metalization, to prevent cross-talk between the different levels of metalization, and to reduce device power consumption.

One family of insulation films that the industry is currently working on integrating into established integrated circuit manufacturing processes includes carbon-doped silicon oxide films. One method of depositing such carbon-doped silicon oxide films includes flowing a process gas including an organosilane and ozone into a deposition chamber and heating the substrate to a temperature between 100–250° C. during a film deposition step. A subsequent chamber clean step flows remotely dissociated fluorine atoms into the chamber to remove deposition material formed on the interior chamber walls. A DPA device can be connected to the chamber foreline to prevent particle build up in the vacuum pump.

Integration of such new technology into established integrated circuit manufacturing processes sometimes creates new issues or problems that need to be solved. For example, it has been found that after extended periods of operation, a sequence of deposition and clean processes such as those associated with the carbon-doped silicon oxide film just described may result in the formation of an organic polymer film within the DPA that is not etched away or otherwise removed by forming the DPA plasma during the chamber clean step. Instead, the present inventors have found that the organic material is resistant to fluorine etching.

SUMMARY OF THE INVENTION

The present invention provides a method of keeping a foreline clean in a deposition process that uses an organosilane gas to deposit a carbon-doped silicon oxide or other type film and prevents or at least minimizes the build up of an organic polymer material within a DPA connected to the foreline. The present invention achieves these goals while being process transparent. That is, in preferred embodiments, operation of the present invention takes no additional processing time to prevent particulate matter from building up within the foreline. Also, in some embodiments, the present invention does not require the use of additional gases and/or consumable parts.

In one embodiment, the method of the present invention solves organic material/organic polymer build up problem by forming a plasma within the DPA during the deposition process of the carbon-doped silicon oxide layer while the deposition gas, which includes oxygen, is flowed into the chamber. It is believed that oxygen from the deposition gas that is exhausted from the chamber into the DPA readily reacts, under plasma conditions, with carbon atoms from the residue or particulate matter collected within the DPA to form carbon monoxide (CO), carbon dioxide ($CO_2$) and steam ($H_2O$) among other volatile products. The oxygen exhausted into the DPA may be unreacted ozone or molecular oxygen, oxygen ions, oxygen-containing reaction byproducts and/or the like, that are exhausted from the chamber during the chamber clean process.

This embodiment also activates the DPA (i.e., forms a plasma within the DPA) during chamber clean operations and switches the plasma formation device OFF (i.e., stops plasma formation within the device) at other times including the time during which purge gases are flowed into the chamber and various chamber set up or conditioning steps are performed. In this manner the etchant gas (e.g., a fluorine species) exhausted from the chamber during the clean operation reacts under plasma conditions with the remaining material within the DPA to keep the foreline clean and prevent a build up of material that could otherwise clog the DPA.

One version of this embodiment of the method of the present invention includes depositing a film over a substrate disposed in the substrate processing chamber by (i) flowing a deposition gas including an organosilane into the substrate processing chamber, exhausting at least some of the deposition gas from the processing chamber through an exhaust line and into the downstream plasma apparatus, and forming a plasma within the downstream plasma apparatus; and then (ii) stopping the flow of the deposition gas, turning the plasma OFF, and flowing a purge gas into the substrate processing chamber. After one or more film deposition steps, the chamber is then cleaned to remove film deposition from the interior surfaces of the chamber by (i) flowing an etchant into the substrate processing chamber, exhausting the etchant from the substrate processing chamber through an exhaust line and into the downstream plasma apparatus, and forming a plasma within the downstream plasma apparatus; and then (ii) stopping the flow of the etchant, turning the plasma formation apparatus OFF, and flowing a purge gas into the substrate processing chamber.

Other embodiments of the present invention add a flow of an oxygen-containing gas or a halogen-containing gas into the foreline upstream of the downstream plasma apparatus or directly into the downstream plasma apparatus to facilitate breakdown of organic material within the DPA. In one of these embodiments, a plasma is formed within the DPA during a chamber clean step and not during the deposition step. At this time a flow of oxygen is also added directly to the DPA or to the foreline upstream of the DPA. Thus, the plasma within the DPA includes active species dissociated from oxygen and from the clean gas. One version of this embodiment diverts the flow of ozone generated by an ozone generator and flowed into the chamber for the deposition step into the DPA during the chamber clean.

In another of these embodiments, a plasma is formed in the DPA during a film deposition step but not during chamber clean step. At this time, an extra flow of a halogen-source is added to the DPA through a gas line that is either directly connected to the DPA or connects to the foreline upstream of the DPA. The plasma within the DPA during the deposition step thus includes active species dissociated from the halogen-source and the oxygen-source used in the film deposition step. One version of this embodiment flows $NF_3$ directly into the DPA. Another version flows remotely dissociated $NF_3$ into the DPA.

These and other embodiments of the present invention, as well as its advantages and features are described in more detail in conjunction with the text below and attached figures.

BRIEF DESCRIPTION OF THE DRAWINGS

FIGS. 2(a)–2(c) are diagrams illustrating an exemplary DPA device that can be connected to receive the exhaust stream from a substrate processing chamber to practice the method of the present invention.

DESCRIPTION OF THE SPECIFIC EMBODIMENTS

I. Introduction

The present invention provides an improved method of cleaning material from the foreline of a substrate processing chamber. The method employs a plasma formation device downstream from the substrate processing chamber, i.e., connected to the exhaust line of the substrate processing chamber, and turns the plasma formation device ON and OFF during specific chamber operations to increase the efficiency of the device and enable the device to remove organic and other material deposited within the foreline.

The method of the present invention prevents the foreline or DPA from clogging in a carbon-doped silicon oxide (Si—O—C) deposition process or other process employing an organosilane in the deposition gas. In such processes an organic polymer residue or other organic material may build up in the DPA or foreline that is not readily removed by only forming a plasma within the DPA when a halogen etchant is exhausted through the DPA. The method is particularly useful in deposition processes that employ an organosilane having at least one silicon-carbon bond as such processes generally produce more organic carbon material in the DPA than processes using an organosilane without a silicon-carbon bond.

The method of the present invention is usable with substrate processing chambers of conventional design having one or more of a variety of DPA devices coupled to the chamber exhaust line. As used herein, a DPA or Downstream Plasma Apparatus is any device that can be inserted in the exhaust path of the chamber and can be used to collect deposition particles and/or residue and convert the trapped particles to a volatile product with the help of a plasma formed within the device. The term DPA is not intended to refer only to those devices described in the previously mentioned 08/741,230 and 09/354,925 patent applications.

II. Exemplary Semiconductor Processing Chamber

The method of the present invention can be used in conjunction with a variety of different semiconductor processing devices having plasma formation devices. One suitable device, a chemical vapor deposition machine, is shown in FIG. 1 which is a cross-sectional view of a simplified, parallel plate chemical vapor deposition system 10.

Figure 1:
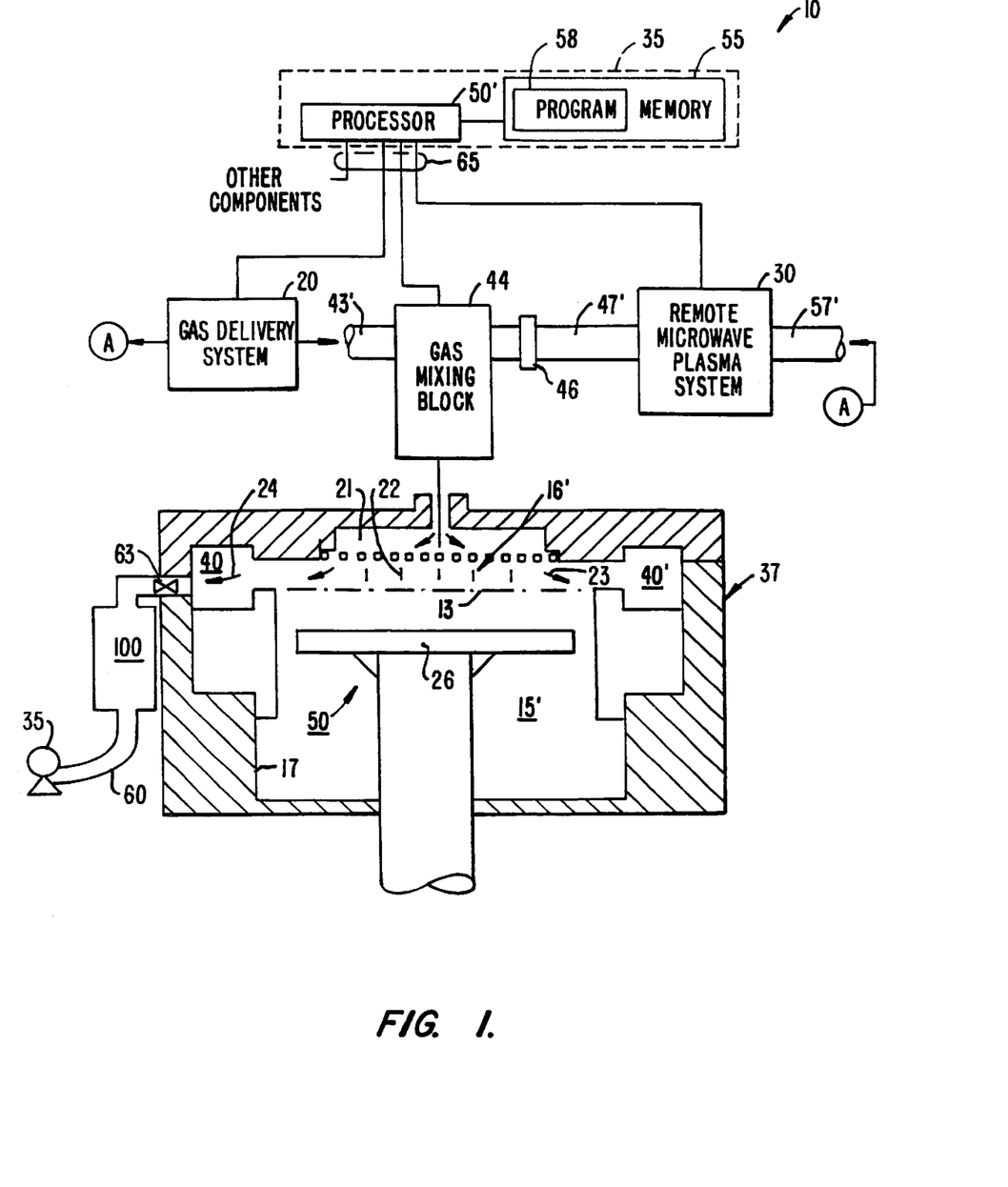
FIG. 1 illustrates one embodiment of a simplified chemical vapor deposition apparatus with which the method of the present invention may be employed.

FIG. 1 is a simplified diagram of an exemplary chemical vapor deposition ("CVD") system 10 with which the method of the present invention can be practiced. This system is suitable for performing thermal, sub-atmospheric CVD ("SACVD") processes, as well as other processes, such as reflow, drive-in, cleaning, etching, and gettering processes. Multiple-step processes can also be performed on a single substrate or wafer without removing the substrate from the chamber. The major components of the system include, among others, a vacuum chamber 15 that receives process and other gases from a gas delivery system 20, a vacuum system 25, a remote plasma system 30, and a control system 35. These and other components are described in more detail below.

CVD apparatus 10 includes an enclosure assembly 37 that forms vacuum chamber 15 with a gas reaction area 16. A gas distribution plate 21 disperses reactive gases and other gases, such as purge gases, through perforated holes toward a wafer (not shown) that rests on a vertically movable heater 26 (also referred to as a wafer support pedestal). Between gas distribution plate 21 and the wafer is gas reaction area 16. Heater 26 can be controllably moved between a lower position, where a wafer can be loaded or unloaded, for example, and a processing position closely adjacent to the gas distribution plate 21, indicated by a dashed line 13, or to other positions for other purposes, such as for an etch or cleaning process. A center board (not shown) includes sensors for providing information on the position of the wafer.

Heater 26 includes an electrically resistive heating element (not shown) enclosed in a ceramic. The ceramic protects the heating element from potentially corrosive chamber environments and allows the heater to attain temperatures up to about 800° C. In an exemplary embodiment, all surfaces of heater 26 exposed to vacuum chamber 15 are made of a ceramic material, such as aluminum oxide ($Al_2O_3$ or alumina) or aluminum nitride.

Reactive and carrier gases are supplied from gas delivery system 20 through supply lines 43 into a gas mixing box (also called a gas mixing block) 44, where they are mixed together and delivered to gas distribution plate 21. Gas delivery system 20 includes a variety of gas sources and appropriate supply lines to deliver a selected amount of each source to chamber 15 as would be understood by a person of skill in the art. Generally, supply lines for each of the gases include shut-off valves that can be used to automatically or manually shut-off the flow of the gas into its associated line, and mass flow controllers or other types of controllers that measure the flow of gas or liquid through the supply lines. Depending on the process run by system 10, some of the sources may actually be liquid sources, such as trimethylsilane ("TMS"), or tetramethylsilane ("T4MS"), rather than gases. When liquid sources are used, gas delivery system includes a liquid injection system or other appropriate mechanism (e.g., a bubbler) to vaporize the liquid. Vapor from the liquids is then usually mixed with a carrier gas as would be understood by a person of skill in the art. Gas delivery system may also include an ozone generator to generate ozone from a supply of molecular oxygen when ozone is required by a process run on system 10.

Gas mixing box 44 is a dual input mixing block coupled to process gas supply lines 43 and to a cleaning/etch gas conduit 47. A valve 46 operates to admit or seal gas or plasma from gas conduit 47 to gas mixing block 44. Gas conduit 47 receives gases from an integral remote microwave plasma system 30, which has an inlet 57 for receiving input gases. During deposition processing, gas supplied to the plate 21 is vented toward the wafer surface (as indicated by arrows 23), where it may be uniformly distributed radially across the wafer surface in a laminar flow.

Purging gas may be delivered into the vacuum chamber 15 from gas distribution plate 21 and/or from inlet ports or tubes (not shown) through the bottom wall of enclosure assembly 37. Purge gas introduced from the bottom of chamber 15 flows upward from the inlet port past the heater 26 and to an annular pumping channel 40. Vacuum system 25 which includes a vacuum pump 35 that pumps gas from within chamber 15 (as indicated by arrows 24) through an exhaust line (foreline) 60. The rate at which exhaust gases and entrained particles are drawn from the annular pumping channel 40 through the exhaust line 60 is controlled by a throttle valve system 63.

Remote microwave plasma system 30 can produce a plasma for selected applications, such as chamber cleaning or etching native oxide or residue from a process wafer. Plasma species produced in the remote plasma system 30 from precursors supplied via the input line 57 are sent via the conduit 47 for dispersion through gas distribution plate 20 to vacuum chamber 15. Remote microwave plasma system 30 is integrally located and mounted below chamber 15 with conduit 47 coming up alongside the chamber to gate valve 46 and gas mixing box 44, which is located above chamber 15. Precursor gases for a cleaning application may include fluorine, chlorine and/or other reactive elements. Remote microwave plasma system 30 may also be adapted to deposit CVD films flowing appropriate deposition precursor gases into remote microwave plasma system 30 during a film deposition process.

The temperature of the walls of deposition chamber 15 and surrounding structures, such as the exhaust passageway, may be further controlled by circulating a heat-exchange liquid through channels (not shown) in the walls of the chamber. The heat-exchange liquid can be used to heat or cool the chamber walls depending on the desired effect. For example, hot liquid may help maintain an even thermal gradient during a thermal deposition process, whereas a cool liquid may be used to remove heat from the system during an in situ plasma process, or to limit formation of deposition products on the walls of the chamber. Gas distribution manifold 21 also has heat exchanging passages (not shown). Typical heat-exchange fluids water-based ethylene glycol mixtures, oil-based thermal transfer fluids, or similar fluids. This heating, referred to as heating by the "heat exchanger", beneficially reduces or eliminates condensation of undesirable reactant products and improves the elimination of volatile products of the process gases and other contaminants that might contaminate the process if they were to condense on the walls of cool vacuum passages and migrate back into the processing chamber during periods of no gas flow.

System controller 35 controls activities and operating parameters of the deposition system. System controller 35 includes a computer processor 50 and a computer-readable memory 55 coupled to processor 50. Processor 50 executes system control software, such as a computer program 58 stored in memory 70. Memory 70 is preferably a hard disk drive but may be other kinds of memory, such as read-only memory or flash memory. System controller 35 also includes a floppy disk drive (not shown).

The above reactor description is mainly for illustrative purposes, and the method of the present invention may be used with other CVD equipment such as plasma enhanced (PECVD) devices, electron cyclotron resonance (ECR) plasma CVD devices, induction coupled RF high density plasma CVD devices, or the like.

Figure 2A:
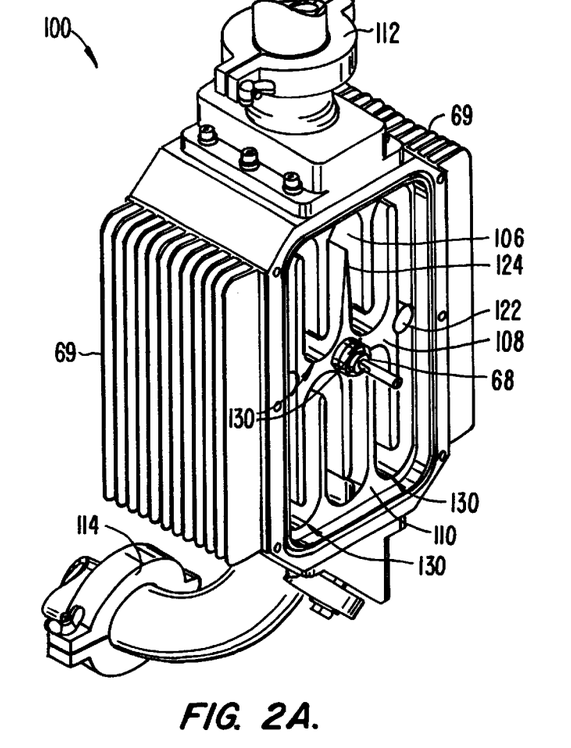
FIG. 2(a) is a perspective view of the exemplary DPA.
Figure 2B:
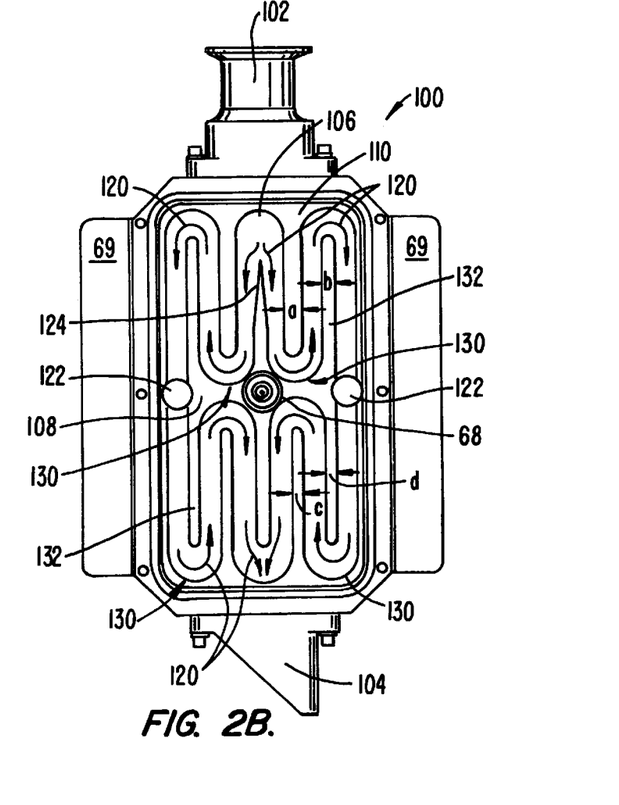
FIG. 2(b) is a front view of the DPA shown in FIG. 2(a)
Figure 2C:
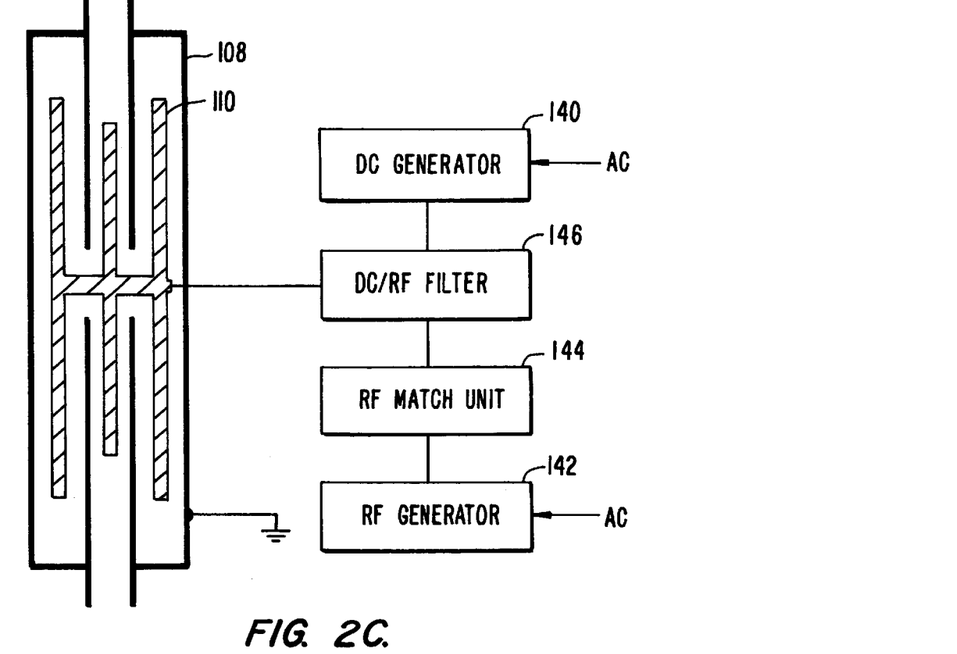
FIG. 2(c) is an electrical diagram of the DPA shown in FIGS. 2(a) and 2(b)

Connected to foreline 60 of chamber 15 is a DPA device 100. As previously described, DPA 100 collects particles exhausted from chamber 15 and converts the collected particles to volatile products that can be pumped through the foreline so that they do not accumulate in and clog vacuum pump 35. FIGS. 2($a$)–2($c$) illustrate one embodiment of an exemplary foreline cleaning device that is usable with the method of the present invention to prevent residue and particle build-up within the foreline. FIG. 2($a$) is a front perspective view of DPA 100 having its door removed; FIG. 2($b$) is a front plane view of the DPA (with the door removed); and FIG. 2($c$) is a schematic diagram showing DPA 100 as an electrical circuit.

As shown in FIGS. 2($a$) and 2($b$), DPA 100 includes an inlet 102 and an outlet 104 (see FIG. 2($b$)). In between inlet 102 and outlet 104 is a fluid conduit 106 (gas passageway) that is defined by a pair of opposing aluminum electrodes: cathode 108 and anode 110 (see FIG. 2($a$)). DPA 100 is connected to the foreline (or directly connected to the processing chamber) through coupling mechanisms 112 and 114 (FIG. 2($a$)). For example, in one embodiment DPA 100 is connected directly to the chamber exhaust port by coupling mechanism 112 and the beginning of the foreline is connected to the DPA at coupling mechanism 114. Gases and particulate matter exhausted into the foreline from the substrate processing chamber pass into DPA 100 through inlet 102. Gases then exit from outlet 104.

A removable aluminum door (not shown) encloses gas passageway 106 along with an aluminum backplate (not shown). The aluminum door and backplate are electrically coupled to electrode (anode) 110. Electrodes 108 and 110, along with the door and backplate form an enclosed vacuum chamber (fluid conduit 106) that prevents gases exhausted into DPA 100 from escaping. The door and backplate each include a ceramic insulation plate (not shown), which contacts the electrodes to form a seal that prevents gases exhausted through the DPA from migrating outside a gas flow path indicated by arrows 120 (FIG. 2($b$)).

Electrodes 108 and 110 are electrically separated from each other by four insulative plugs (made from ceramic in one embodiment) 122 (FIG. 2($a$)), which are also referred to as cathode retainers. As shown in the FIGS., electrodes 108 and 110 have grooves machined in them to house a portion of the cathode retainers. Two cathode retainers 122 are shown in the drawings on the front side of the DPA and the other two are similarly positioned on the backside of the DPA. Cathode retainers 122 do not extend the entire width of gas passageway 106 and thus do not block the gas flow through the passageway.

Figure 4:
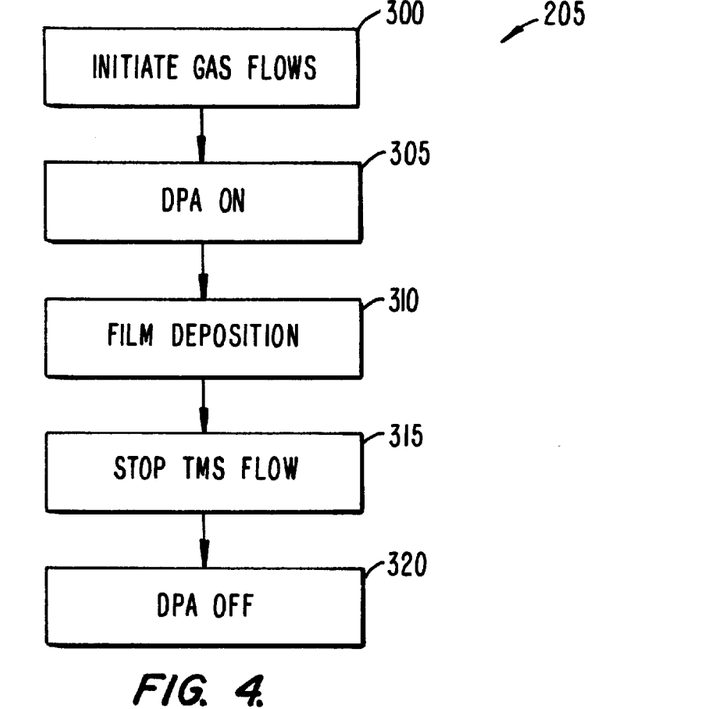
FIG. 4 is a flowchart illustrating one embodiment of deposition step 205 shown in FIG. 3.

Gas flow in the DPA follows fluid conduit 106 as indicated by arrows 120 (FIG. 2($b$)). Fluid conduit 106 includes two mirror image gas flow paths. An extruding portion of cathode 108 (flow divider 124—see FIG. 4($b$)) directs the effluent gas into one of the two flow paths. Approximately half the gas flow is diverted toward the passage on the left side of DPA 100 while the other half is diverted toward the right side of the device.

Fluid conduit 106 is a labyrinthal/serpentine passageway that includes particle collection areas 130 that rely in part on gravitational forces to collect and trap particles present in the effluent gas stream, e.g., particles generated during a substrate deposition or other type of processing step. Each particle collection area 130 is a "U"-shaped segment of the gas passageway that is situated so that particles are collected and held within the bottom area of the "U" portion by gravitational forces despite an effluent gas flow path that attempts to drag the particles out of the DPA. Gas flow is directed through each "U" portion by an extruding finger 132 of either cathode 108 or anode 110 as shown in FIG. 2(*b*). These particle collection areas 130 are collectively referred to as a gravity or mechanical trap.

Electrodes 108 and 110 form both a parallel plate plasma generation system and an electrostatic particle collector. As part of an electrostatic particle trap, DC power is applied to electrode 108 while electrode 110 is grounded to attract exhausted particulate matter which is electrically charged. The applied DC power creates a voltage field that attracts positively charged particles exhausted through the DPA on one electrode and attracts negatively charged particles on the other. Being grounded, electrode 110 also acts as a Faraday cage for RF shielding. As part of a plasma generation system, RF power is applied to electrode 108. The applied RF power forms a plasma from effluent gases passing through the DPA and etches away particles and residue collected in either the gravity trap areas 130 or along the surface of electrodes 108 and 110.

FIG. 2(*c*) is a diagram showing the electrical circuit that includes electrodes 108 and 110. As shown in FIG. 2(*c*), electrode 105 is connected to both a DC generator 140 and an RF generator 142 while electrode 110 is grounded. DC generator 140 supplies the DC voltage required by the electrostatic trap, and RF generator 142 supplies the RF power to form a plasma. An RF match circuit 144 matches the generator output impedance to 50 Ω to minimize the reflected power, and a DC/RF filter (a low pass RC filter) 146 isolates DC power supply 140 from the RF signal interferences.

To ensure complete reaction of material passing through and/or deposited within DPA 100, the DPA is driven by the RF power supply (e.g., RF generator 142) at a level sufficient to form and/or maintain a plasma. Generally, a power level of between 50–2000 Watts or more can be employed depending on the surface area of the cathode and the desired intensity of the plasma. The power supply driving DPA 40 is operated at a frequency range from about 50 KHz to about 200 MHz or more and is preferably operated in the range of about 50 KHz to 60 MHz. Generally, lower frequency power supplies are less expensive to purchase and operate than higher frequency supplies. Accordingly, in some embodiments, the power supply driving DPA 40 is designed to provide RF frequency of 325 KHz or less. Other embodiments, however, drive the DPA using a 13.576 MHz power supply that is also coupled to an electrode within a deposition chamber.

As previously stated, RF energy is applied to electrode 56 to form and/or maintain a plasma from effluent gases exhausted into the DPA. Constituents from the plasma react with the particles and residue trapped within the DPA from one or more previous substrate processing steps. The method of the present invention selectively applies the application of RF energy to form this plasma during the operation of substrate processing system 10. Control of the timing aspects of DPA 100 (e.g., switching RF power supply 102 and/or DC power supply 100 ON and OFF) is generally performed by processor 50 through the application of control signals sent over control lines 65 shown in FIG. 1. Even though not shown in FIG. 1, such control lines are connected to DPA 100 in such a configuration.

III. The Operation of a Downstream Plasma Apparatus According to the Present Invention The method of the present invention can be used with a substrate processing chamber and DPA such as exemplary CVD system 10 and exemplary DPA 100 described above to keep the chamber's foreline clean during deposition of Si—O—C and other films in which organic polymer or similar material may build up inside the DPA after extended wafer runs. As previously stated, the present inventors discovered that such Si—O—C deposition processes may leave an organic residue within the foreline or a DPA that is difficult to remove using a conventional fluorine etchant plasma.

Figure 3:
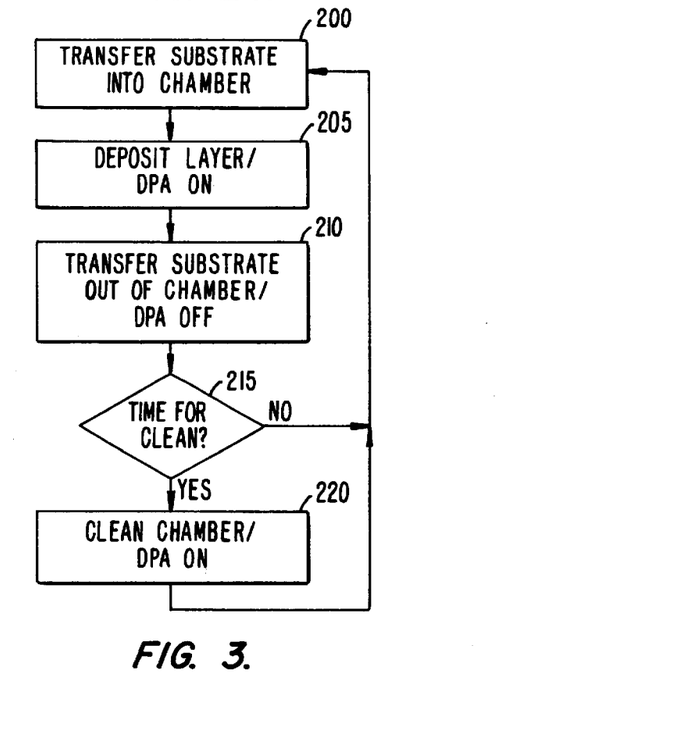
FIG. 3 is a flowchart illustrating one embodiment of the method of the present invention.

FIG. 3 illustrates one embodiment of the method of the present invention used to keep the foreline of a substrate processing chamber clean in a trimethylsilane (TMS)/ozone carbon-doped silicon oxide film deposition process. The illustration of a TMS/ozone film deposition process is for exemplary purposes only. The present invention can be used to keep the prevent particle accumulation and residue build up for a variety of different film deposition processes including carbon-doped silicon oxide film processes that use organosilane sources other than TMS. Examples of some of other organosilane sources include sources having at least one silicon-carbon bond and include methylsilane, dimethylsilane (DMS), tetramethylsilane (T4MS) and phenylmethylsilane among others.

As shown in FIG. 3, a substrate is first transferred into substrate deposition chamber 15 (step 200). Next deposition gases (TMS, ozone and a helium carrier gas) are flowed into the chamber and DPA 100 is turned ON to form a plasma from the deposition gases as they and reaction byproducts are exhausted through the DPA (step 205). After film deposition is complete, the substrate is transferred out of the chamber and the plasma within DPA 100 is switched OFF (step 210).

If it is time for the chamber to be cleaned in an in situ cleaning operation (step 215), clean step 220 is initiated. If not, a next substrate is transferred into the chamber (step 200) and the deposition process is repeated. In some embodiments of the present invention, the chamber is cleaned after every substrate deposition step. Accordingly, decision step 215 is unnecessary in these embodiments.

Clean step 220 flows remotely dissociated fluorine atoms (from remote plasma system 30) from an $NF_3$ source gas into chamber 15 to remove unwanted deposition material that has built up on chamber walls and other components within the interior of chamber 15. In one embodiment, the gas flowed into chamber 15 during step 220 includes molecular oxygen and helium flows also flowed through remote plasma system 30. DPA 100 is turned back ON during step 220 so that a plasma is formed within the DPA from the etchant/clean gas after it is exhausted from chamber 15. DPA 100 is then turned OFF after the completion of step 220 and while a next substrate is transferred into chamber 15 in step 200.

The present inventors have discovered that remote fluorine clean (step 220) is effective at removing silicon oxide residue that builds up within the deposition chamber but is not completely effective at removing organic material including hydrocarbons (C—C and C—H compounds) and fluorocarbons (C—$F_x$ compounds) that can build up within the DPA during the TMS/ozone process. The present inventors further discovered that turning DPA 100 ON while ozone or another oxygen source is flowed through chamber 15 during deposition step 205 enables the oxygen from the plasma within the DPA to react with carbon hydrides and other carbon compounds that may build up within the DPA. The byproduct of such reactions, CO, $CO_2$ and $H_2O$, are volatile products that can then be pumped out of the DPA device and through the foreline within interfering with pump 35. Any remaining residue within the DPA is then subject to a fluorine (or other halogen element depending on the chamber clean chemistry) plasma during step 220. Turning DPA 100 OFF between deposition step 205 and clean 220 saves power and other operating expenses associated with the DPA.

As described herein, turning DPA 100 ON and OFF refers to the application of RF power to electrodes 108 and 110 to form a plasma within the DPA. It does not refer to turning the electrostatic trap ON or OFF using DC generator 140. DPA device 100 shown in FIGS. 2(a)–2(c) is configured so that the electrostatic trap is constantly ON while power is supplied to the DPA. The present inventors have found, however, that particles generated by the TMS/ozone deposition process described in conjunction with FIG. 3 are generally not electrically charged. Accordingly, other DPA devices that do not include an electrostatic trap may be effectively used with the present invention. Furthermore, and as previously stated, DPA devices that use different plasma formation techniques, e.g., inductive or microwave energy, can be employed.

In other embodiments of the present invention, DPA 100 is switched ON and OFF within deposition and chamber cleaning steps 205 and 220 based on the flow of gases into chamber 15. FIG. 4 is a flowchart illustrating one embodiment of deposition step 205 shown in FIG. 3. In FIG. 4, deposition step 205 starts with an initiation of molecular oxygen (5000 sccm) and helium (8000 sccm) gas flows without DPA 100 ON (step 300) in order to bring chamber pressure up to a desired pressure level of 80 Torr. After the desired chamber pressure is reached, DPA 100 is turned ON by applying 800 Watts of RF power to cathode 110 (step 305). Film deposition is then initiated by switching the oxygen flow to a 5000 sccm 15% ozone diluted in oxygen flow and adding a flow of 225 sccm TMS to the deposition gas (step 310). Deposition step 310 is maintained until the desired film thickness is reached and then the flow of TMS is stopped (step 315). Deposition step 205 is then completed by switching the DPA OFF, stopping the ozone flow and allowing the helium flow to purge chamber 15 of the deposition gases.

Figure 5:
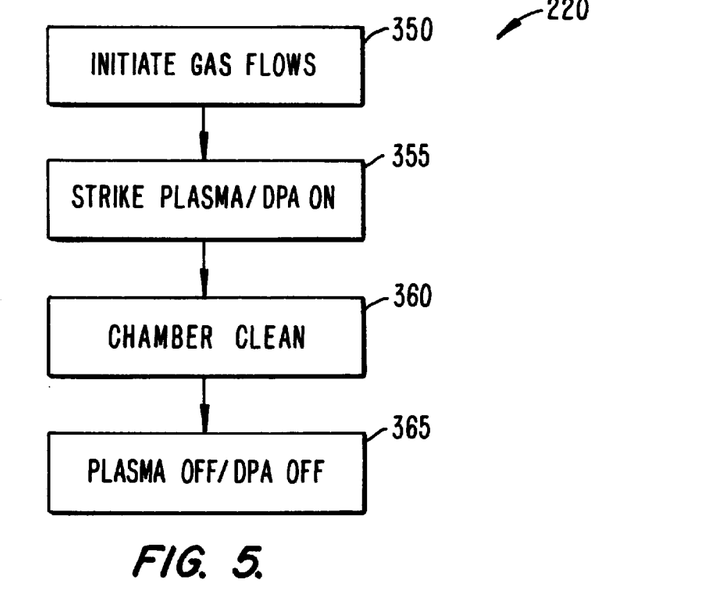
FIG. 5 is a flowchart illustrating one embodiment of chamber clean step 220 shown in FIG. 3.

FIG. 5 is a flowchart illustrating one embodiment of chamber clean step 220 shown in FIG. 3. In FIG. 5, clean step 220 starts with a brief flow of $NF_3$ (10 sccm) and $N_2$ (850 sccm) into remote microwave plasma system 30 and then through chamber 15(step 350). Next, a 500 sccm helium flow is added to the clean gas, a plasma is formed in remote plasma system 30 and a plasma is formed within DPA 100 using 700 Watts of RF power at 13.56 MHz) (step 355). $NF_3$ flow is increased to 950 sccm and the $N_2$ flow is replaced with a 500 sccm flow of molecular oxygen during chamber clean step 360. After completion of the chamber clean process based on either endpoint detection or a fixed time period, the $NF_3$ flow is stopped, the plasma in the remote plasma system 30 is switched OFF and DPA 100 is switched OFF (step 365) while the helium and oxygen flows are set to 8000 and 5000 sccm, respectively, to purge chamber 15.

In some embodiments deposition step 205 may include various pre-deposition or post-deposition treatment steps. For example, deposition step 205 may include a pre-deposition treatment step that exposes the substrate to a hydrogen plasma prior to the deposition of the TMS/ozone layer to improve adhesion of the layer to underlying meta lines. Alternatively, or in addition to, deposition step 205 may include a post-deposition treatment step that exposes the substrate to a nitrogen plasma to densify the deposited TMS/ozone layer. While DPA 100 may be turned ON to form a plasma within the device during these steps, currently preferred embodiments leave the DPA OFF at these times to conserve power. Experiments have demonstrated that forming a plasma within the DPA during deposition step 205 and clean step 220 is sufficient at preventing deposition build up within the DPA from clogging the DPA or otherwise reducing its performance. Also, if the deposited TMS/ozone layer is subjected to an in-situ cure step within the deposition chamber, currently preferred embodiments switch the DPA OFF during the cure step.

Other embodiments of the present invention form a plasma in only one of the deposition or cleaning steps. In these embodiments, an additional flow of gas is added to the DPA during plasma formation to facilitate the breakdown of organic material within the DPA. For example, in one embodiment where a plasma is formed in the DPA during a film deposition step, an extra flow of a halogen-source is added to the DPA during that time through a gas line that is either directly connected to the DPA or connects to the foreline upstream of the DPA. The plasma within the DPA during the deposition step thus includes active species dissociated from the halogen-source and the oxygen-source used in the film deposition step. One version of this embodiment flows $NF_3$ directly into the DPA. Another version flows remotely dissociated $NF_3$ into the DPA.

In another embodiment, a flow of oxygen is added directly to the DPA, or to the foreline upstream of the DPA, during the chamber clean step. Thus, when a plasma is formed within the DPA during the clean step the plasma includes active species dissociated from oxygen and from the clean gas. In one version of this embodiment, the oxygen added to the DPA is a flow of ozone diluted in oxygen from an ozone generator that is used to generate ozone for the film deposition step. Such ozone generators typically generate ozone continuously to maintain a stable flow of ozone and divert the unused ozone (ozone not needed for the deposition step) to an abatement unit. This embodiment can divert some or all of the unused ozone to the DPA to facilitate conversion of organic material within the DPA to effluent gases.

Oxygen flows that can be added to the DPA include molecular oxygen, ozone and nitrous oxide among others. Halogen flows that can be added to the DPA include $NF_3$, $F_2$, $C_2F_6$, $C_3F_8$ and other known silicon oxide etchants. It is also possible in certain embodiments to add additional flows of oxygen and or halogen to the DPA and form a plasma within the DPA during the deposition and clean steps.

The gas flow rates recited and described above with respect to FIG. 5 are optimized for a process run in a Gigafill chamber manufactured by Applied Materials and outfitted for 200 mm wafers. A person of ordinary skill in the art will recognize that the rates at which various precursor gases in the process gas are introduced are in part chamber specific and will vary if chambers of other design and/or volume are employed.

Having fully described at least one embodiment of the present invention, other equivalent or alternative methods of removing particulate matter from a vacuum line according to the present invention will be apparent to those skilled in the art. For example, while the present invention was primarily described in conjunction with a carbon-doped silicon oxide deposition process, the inventors believe that is can be used to improve foreline cleaning in any deposition process that employs an organosilane in the deposition gas and forms organic material in the foreline. These equivalents and alternatives along with the understood obvious changes and modifications are intended to be included within the scope of the present invention.

What is claimed is:

1. A method of operating a substrate processing chamber, said method comprising:

flowing a deposition gas comprising an organosilane into said chamber during a film deposition step to deposit a layer over said substrate; and thereafter, flowing an etchant into said chamber during a chamber clean step to remove material deposited on interior walls of said chamber;

said method also comprising:

flowing at least one of an oxygen source and oxygen-containing byproducts into a downstream plasma apparatus fluidly coupled to receive an effluent stream from said chamber and concurrently forming a plasma within said apparatus; and flowing at least one of a halogen source and halogen-containing byproducts into said downstream plasma apparatus and concurrently forming a plasma within said apparatus.

2. The method of claim 1 wherein said at least one of said oxygen source and oxygen-containing byproducts flowed into said downstream plasma apparatus are exhausted from said chamber during said film deposition step and said at least one of said halogen source and halogen-containing byproducts flowed into said downstream plasma apparatus are exhausted from said chamber during said chamber clean step.

3. The method of claim 1 wherein said oxygen source is flowed into said downstream plasma apparatus without being flowed into said chamber and at least one of said halogen source and halogen-containing byproducts flowed into said downstream plasma apparatus are exhausted from said chamber during said chamber clean step.

4. The method of claim 3 wherein said oxygen source is selected from the group of molecular oxygen, nitrous oxide.

5. The method of claim 1 wherein said at least one of said oxygen source and oxygen-containing byproducts flowed into said downstream plasma apparatus are exhausted from said chamber during said film deposition step and said halogen source is a flow of a halogen-containing gas flowed into said downstream plasma apparatus without being flowed into said chamber.

6. The method of claim 1 wherein said deposition gas comprises carbon, silicon and oxygen.

7. The method of claim 1 wherein said deposition gas comprises an organosilane having at least one silicon-carbon bond and ozone.

8. The method of claim 1 wherein said etchant comprises a remotely dissociated halogen.

9. The method of claim 8 wherein said etchant comprises remotely dissociated nitrogen trifluoride and oxygen.

10. A method of minimizing particle or residue accumulation within an exhaust line of a substrate processing chamber having a downstream plasma apparatus connected to the exhaust line, said method comprising:

(a) depositing a film over a substrate disposed in said substrate processing chamber by:

flowing a deposition gas including an organosilane into said substrate processing chamber, exhausting at least some of said deposition gas from said processing chamber through an exhaust line and into said downstream plasma apparatus, and forming a plasma within said downstream plasma apparatus; and thereafter, stopping the flow of said deposition gas, turning the plasma in said downstream plasma apparatus OFF, and flowing a purge gas into said substrate processing chamber; and (b) removing film deposition from the interior of said substrate processing chamber by:

flowing an etchant into said substrate processing chamber, exhausting said etchant from said substrate processing chamber through an exhaust line and into said downstream plasma apparatus, and forming a plasma within said downstream plasma apparatus; and thereafter, stopping the flow of said etchant, turning the plasma in said downstream plasma apparatus OFF, and flowing a purge gas into said substrate processing chamber.

11. The method of claim 10 wherein said deposition gas comprises carbon, silicon and oxygen.

12. The method of claim 10 further comprising an in situ cure process between said film deposition and film removal steps, wherein a plasma is not formed in said downstream plasma apparatus during said film cure process.

13. The method of claim 10 further comprising flowing a remotely dissociated hydrogen source into said substrate processing chamber before said film deposition process, wherein a plasma is not formed in said downstream plasma apparatus during said film cure process.

14. A method of operating a substrate processing chamber of the type having a downstream plasma apparatus coupled to the exhaust of the chamber to convert at least one of particles and residue exhausted from the chamber to volatile products, said method comprising:

(a) transferring a substrate into said substrate processing chamber;

(b) depositing a carbon-doped silicon oxide film over said substrate by:

flowing a deposition gas comprising an organosilane and ozone into said substrate processing chamber, exhausting at least some of said deposition gas from said processing chamber through an exhaust line and into said downstream plasma apparatus, and forming a plasma within said downstream plasma apparatus; and thereafter, stopping the flow of said deposition gas, turning the plasma within said downstream plasma apparatus OFF, and flowing a purge gas into said substrate processing chamber;

(c) transferring said substrate out of said substrate processing chamber; and (d) removing film deposition from the interior of said substrate processing chamber by:

flowing remotely dissociated fluorine into said substrate processing chamber, exhausting said fluorine from said substrate processing chamber through an exhaust line and into said downstream plasma apparatus, and forming a plasma within said downstream plasma apparatus; and thereafter, stopping the flow of said fluorine, turning the plasma within said downstream plasma formation apparatus OFF, and flowing a purge gas into said substrate processing chamber.

15. The method of claim 14 wherein said organosilane has at least one silicon-carbon bond.

16. The method of claim 15 wherein said organosilane is TMS.

17. A method of minimizing particle or residue accumulation within an exhaust line of a substrate processing chamber having a plasma formation apparatus connected to the exhaust line, said method comprising:
  (a) depositing a film over a substrate disposed in said substrate processing chamber by:
    (i) flowing a deposition gas comprising an organosilane and ozone into said substrate processing chamber;
    (ii) exhausting said deposition gas from said processing chamber through an exhaust line and into said plasma formation apparatus;
    (iii) forming a plasma within said plasma formation apparatus;
    (iv) stopping the flow of said deposition gas and turning said plasma formation apparatus OFF; and
    (v) thereafter, flowing a purge gas into said substrate processing chamber;
  (b) transferring the substrate out of said chamber; and
  (c) removing film deposition from the interior of said substrate processing chamber by:
    (i) flowing an etchant into said substrate processing chamber;
    (ii) exhausting said etchant from said substrate processing chamber through an exhaust line and into said plasma formation apparatus;
    (iii) forming a plasma within said plasma formation apparatus;
    (iv) stopping the flow of said etchant and turning said plasma formation apparatus OFF; and
    (v) thereafter, flowing a purge gas into said substrate processing chamber.

18. The method of claim 1 wherein said layer deposited over said substrate is a carbon-doped silicon oxide layer.

19. The method of claim 10 wherein said layer deposited over said substrate is a carbon-doped silicon oxide layer.

20. The method of claim 4 wherein said oxygen source is a flow of ozone generated from an ozone generator and diverted away from said chamber and into said downstream plasma apparatus during said chamber clean step.

* * * * *

UNITED STATES PATENT AND TRADEMARK OFFICE
CERTIFICATE OF CORRECTION

PATENT NO. : 6,255,222 B1
DATED : July 3, 2001
INVENTOR(S) : Xia et al.

It is certified that error appears in the above-identified patent and that said Letters Patent is hereby corrected as shown below:

<u>Title page,</u>
Item [75], Inventor's names, delete "Himanshu Pokharrna" and replace with
-- Himanshu Pokharna --.

Signed and Sealed this

Eleventh Day of February, 2003

JAMES E. ROGAN
*Director of the United States Patent and Trademark Office*